(12) United States Patent
Son et al.

(10) Patent No.: US 7,648,780 B2
(45) Date of Patent: *Jan. 19, 2010

(54) ELECTROLUMINESCENT DEVICES WITH LOW WORK FUNCTION ANODE

(75) Inventors: Se-Hwan Son, Daejeon (KR); Jun-Gi Jang, Daejeon (KR); Sang-Young Jeon, Seoul (KR); Seok-Hee Yoon, Daejeon (KR); Jae-Chol Lee, Daejeon (KR); Kong-Kyeum Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 96 days.

This patent is subject to a terminal disclaimer.

(21) Appl. No.: 11/812,257

(22) Filed: Jun. 15, 2007

(65) Prior Publication Data

US 2007/0257605 A1 Nov. 8, 2007

Related U.S. Application Data

(60) Division of application No. 10/722,812, filed on Nov. 26, 2003, now Pat. No. 7,560,175, which is a continuation-in-part of application No. 09/914,731, filed as application No. PCT/KR00/01537 on Dec. 27, 2000, now Pat. No. 6,720,573.

(30) Foreign Application Priority Data

| Dec. 31, 1999 | (KR) | ............................... 1999-67746 |
| Dec. 26, 2000 | (KR) | ............................... 2000-82085 |
| Dec. 11, 2002 | (KR) | ............................... 2002-78809 |

(51) Int. Cl.
    *H01L 51/54* (2006.01)

(52) U.S. Cl. .................. 428/690; 428/917; 313/503; 313/504; 313/506; 313/113; 257/E51.019; 257/E51.05

(58) Field of Classification Search ........................ None
    See application file for complete search history.

(56) References Cited

U.S. PATENT DOCUMENTS

| 4,356,429 A | 10/1982 | Tang |
| 4,769,292 A | 9/1988 | Tang et al. |
| 4,780,536 A | 10/1988 | Czarnik et al. |
| 5,150,006 A | 9/1992 | VanSlyke et al. |
| 5,294,810 A | 3/1994 | Egusa et al. |
| 5,366,811 A | 11/1994 | Higashi et al. |
| 5,457,565 A | 10/1995 | Namiki et al. |
| 5,540,999 A | 7/1996 | Yamamoto et al. |
| 5,616,427 A | 4/1997 | Tada |
| 5,645,948 A | 7/1997 | Shi et al. |
| 5,766,779 A | 6/1998 | Shi et al. |
| 5,840,217 A | 11/1998 | Lupo et al. |
| 6,046,543 A | 4/2000 | Bulovic et al. |
| 6,099,750 A | 8/2000 | Simmerer et al. |
| 6,312,838 B1 | 11/2001 | Ishibashi et al. |
| 6,404,126 B1 | 6/2002 | Arai et al. |
| 6,436,559 B1 | 8/2002 | Ueno et al. |
| 6,497,969 B2 | 12/2002 | Kim et al. |
| 6,501,217 B2 | 12/2002 | Beierlein et al. |
| 6,602,969 B2 | 8/2003 | Ueda et al. |
| 6,656,608 B1 | 12/2003 | Kita et al. |
| 6,720,573 B2 | 4/2004 | Son et al. |
| 6,963,081 B2 | 11/2005 | Gupta et al. |
| 2002/0011782 A1 | 1/2002 | Lee et al. |
| 2002/0117962 A1 | 8/2002 | Beierlein et al. |
| 2002/0119297 A1 | 8/2002 | Forrest et al. |
| 2002/0158242 A1 | 10/2002 | Son et al. |
| 2003/0159729 A1 | 8/2003 | Shaheen et al. |
| 2004/0023060 A1 | 2/2004 | Kim et al. |
| 2004/0067387 A1 | 4/2004 | Kim et al. |
| 2004/0113547 A1* | 6/2004 | Son et al. ..................... 313/504 |
| 2004/0169175 A1* | 9/2004 | Son et al. ..................... 257/40 |
| 2005/0040390 A1 | 2/2005 | Pfeiffer et al. |
| 2007/0102698 A1* | 5/2007 | Kang et al. ..................... 257/40 |
| 2008/0001532 A1* | 1/2008 | Son et al. ..................... 313/504 |
| 2008/0284325 A1* | 11/2008 | Noh et al. ..................... 313/504 |
| 2009/0009101 A1* | 1/2009 | Kang et al. ................. 315/250 |
| 2009/0058260 A9* | 3/2009 | Noh et al. ..................... 313/499 |

FOREIGN PATENT DOCUMENTS

| CN | 1161002 C | 8/2004 |
| EP | 0 797 375 A2 | 9/1997 |

(Continued)

OTHER PUBLICATIONS

Birnstock et al., "Screen-printed passive matrix displays based on light-emitting polymers", Applied Physics Letters, vol. 78, (24), pp. 3905-3907 (Jun. 2001).

Chang et al., "Dual-color polymer light-emitting pixels processed by hybrid inkjet printing", Applied Physics Letters, 73 (18), pp. 2561-2563 (Nov. 1998).

(Continued)

*Primary Examiner*—Marie R. Yamnitzky
(74) *Attorney, Agent, or Firm*—McKenna Long & Aldridge (57) ABSTRACT

Disclosed are organic electroluminescent devices employing materials of a low reduction potential in a layer functioning hole-injection. The organic electroluminescent devices may employ an anode material having a relatively low work function. Aluminum may be used in anode. During the operation, the organic electroluminescent devices may form a virtual electrode in their internal area, which enhances injection of carriers from a nearby electrode. Use of aluminum in the anode helps construction of cathode-emission organic electroluminescent devices.

15 Claims, 8 Drawing Sheets

FOREIGN PATENT DOCUMENTS

| | | |
|---|---|---|
| EP | 1 099 744 A2 | 5/2001 |
| EP | 1 179 862 A2 | 2/2002 |
| JP | 06-163158 A | 6/1994 |
| JP | 07-011249 A | 1/1995 |
| JP | 08-167477 A | 6/1996 |
| JP | 2000-223276 A | 8/2000 |
| JP | 2002-246184 A | 8/2002 |
| JP | 2005-167175 A | 6/2005 |
| KR | 10-20010062711 | 7/2001 |
| KR | 10-2003/0067773 | 8/2003 |
| TW | 506229 | 10/2002 |
| WO | WO 98/49163 A | 11/1998 |
| WO | WO 99/39393 A1 | 8/1999 |
| WO | WO 01/06576 A1 | 1/2001 |
| WO | WO 01/49806 A1 | 7/2001 |
| WO | WO 03/012890 A2 | 2/2003 |
| WO | WO 2005/109542 | 11/2005 |

OTHER PUBLICATIONS

Chieh-Wei Chen, et al. "An Effective Cathode Structure for Inverted Top-Emitting Organic Light-Emitting Devices", Applied Physics Letters, vol. 85 (13), pp. 2469-2471 (Sep. 2004).

Cui et al., "Indium Tin Oxide Alternatives—High Work Function Transparent Conducting Oxides As Anodes For Organic Light-Emitting Diodes", pp. 1476-1480, Advanced Materials, 2001, 13, No. 19, (Oct. 2001).

Gu, et al., "Transparent Organic Light Emitting Devices", Applied Physics Letters, vol. 68 (19), p. 2606-2608 (May 1996).

Hung, et al. "Interface Engineering in Preparation of Organic Surface-Emitting Diodes", Applied Physics Letters, vol. 74 (21), pp. 3209-3211 (May 1999).

Jie Liu, et al. "Efficient Bottom Cathodes for Organic Light-Emitting Devices", Applied Physics Letters, vol. 85 (5), pp. 837-839 (Aug. 2004).

Kim, J.S. et al., "Indium-tin oxide treatmenst for single-and double-layer polymeric light-emitting diodes: The relation between the anode physical, chemical, and morphological properties and the device performance", Journ. of Applied Physics, vol. 84, No. 12, pp. 6859-6870 (Dec. 1998).

Kruger, Jessica et al., "Modification of $TiO_2$ Heterojunctions with Benzoic Acid Derivatives in Hybrid Molecular Solid-State Devices," Advanced Materials, vol. 12, pp. 447-451 (2000).

Parthasarathy, et al. "A Metal-Free Cathode for Organic Semiconductor Devices" Applied Physics Letters, vol. 72, (17), pp. 2138-2140 (Apr. 1998).

Pieterse Koen et al., "Towards Organic N-Type Semi-Conducting Materials", Polymer preprint, 40, pp. 404-405 (1999).

* cited by examiner

ELECTROLUMINESCENT DEVICES WITH LOW WORK FUNCTION ANODE

RELATED APPLICATION

This application is a divisional of U.S. patent application Ser. No. 10/722,812, filed Nov. 26, 2003, now U.S. Pat. No. 7,560,175 which claims foreign priority based on Korean Patent Application No. 2002-78809, filed Dec. 11, 2002, both of which are hereby incorporated herein by reference in its entirety; U.S. patent application Ser. No. 10/722,812 is also a continuation-in-part of U.S. application Ser. No. 09/914,731, filed Aug. 30, 2001, now U.S. Pat. No. 6,720,573, which is a national stage application of International Patent Application PCT/KR00/01537 filed on Dec. 27, 2000 that claims priority to Korean Patent Application No. 2000-82085, filed Dec. 26, 2000, and Korean Patent Application No 1999-067746, filed Dec. 31, 1999.

BACKGROUND OF THE INVENTION

1. Field of the Invention

The present invention relates to display technology. More particularly, the present invention relates to organic electroluminescent devices.

2. Description of the Related Art

Organic luminescence or organic electroluminescence is an instance in which electric current is converted into visible light by internal processes of organic compounds. Organic compounds having either fluorescent or phosphorescent characteristics generate light emission upon the application of electric current. Both organic fluorescent and phosphorescent molecules are referred to as organic light-emitting compounds.

An organic luminescent or electroluminescent device is generally composed of two opposing electrodes and at least one layer interposed between the two electrodes. The at least one layer between the electrodes contains at least one organic light-emitting compound. Electrons and holes, collectively referred to as carriers, are injected into the layer from the two electrodes, which are a cathode and an anode. Upon application of appropriate electric power, the cathode is to inject electrons toward the interposed layer, while anode is to inject holes toward the same layer.

Performance of organic electroluminescent devices depends on, among many factors, the quantity of the carriers injected from the electrodes. The more the carriers are injected, the more likely to have high luminescence or brightness. To inject a large number of carriers from the electrodes at a low driving voltage, materials for the electrodes are chosen such that the carriers are easily injected therefrom. The anode is generally made from materials having a high work function. The cathode is generally made from materials having a low work function. In a single electroluminescent device, the work function of the anode material is higher than that of the cathode material.

Further, to inject a larger number of carriers from the electrodes at a low driving voltage, carrier-injecting layers may be introduced. The carrier-injecting layers are to facilitate injection of carriers from the electrodes. A hole-injecting layer may be formed on the side of the anode, facing the cathode. An electron-injecting layer may be formed on the side of the cathode, facing the anode. Materials for the carrier-injecting layers are also chosen such that the carrier-injecting layers easily receive carriers from the electrodes. The hole-injecting layer is generally made from materials having a low oxidation potential, which are easily oxidized at a low electric potential applied. The electron-injecting layer is generally made from materials having a low reduction potential, which are easily reduced at a low electric potential applied.

SUMMARY OF THE INVENTION

One aspect of the present invention provides various electroluminescent devices. According to one embodiment of the present invention, an electroluminescent device comprises: a cathode; an anode opposing the cathode, the anode comprises a material having a work function not greater than about 4.5 eV; and a functional layer located between the anode and cathode, the functional layer comprises a chemical compound of Formula I:

Formula I

In the formula, R1-R6 are independently chosen from the group consisting of hydrogen, halo, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—CO—OR), amide (—CO—NHR or —CO—NRR'), straight-chain or branched (substituted or unsubstituted) C$_1$-C$_{12}$ alkoxy, straight-chain or branched (substituted or unsubstituted) C$_1$-C$_{12}$ alkyl, aromatic or non-aromatic (substituted or unsubstituted) heterocyclic, substituted or unsubstituted aryl, mono- or di-(substituted or unsubstituted)aryl-amine, and (substituted or unsubstituted)alkyl-(substituted or unsubstituted)aryl-amine.

In the above described device, the work function of the material in the anode ranges from about 3.5 eV to about 4.5 eV. The chemical compound has a reduction potential ranged from about −0.6V to about 0 V. The chemical compound is more stable in a reduced state thereof than in a neutral state thereof. The chemical compound has an electron mobility from about $10^{-10}$ cm/V·s to about $10^{-5}$ cm/V·s. The chemical compound has a hole mobility from about $10^{-4}$ cm/V·s to about 1 cm/V·s. The chemical compound is Formula Ia:

Formula Ia

Still in the above described device, the functional layer is configured to facilitate movement of charge carriers from the anode in a direction toward the cathode. The functional layer substantially contacts the anode. The anode is made substantially of one or more conductive materials, and wherein the device further comprises an intervening layer between the functional layer and the anode. The intervening layer comprises one or more metallic oxides. The functional layer comprises the chemical compound of Formula I in an amount ranging from 1 wt % to 100 wt %. The functional layer has a thickness from 0.1 nm to 10,000 nm. The device further comprises a light-emitting layer between the cathode and the functional layer. The device further comprises a substrate, wherein the anode is located between the substrate and the functional layer. The anode comprises a transparent material. The anode comprises a metal oxide material. The device further comprises a substrate, wherein the cathode is located between the substrate and the functional layer. The cathode comprises a transparent material. The anode comprises an opaque material. The anode comprises a reflective material having a reflectivity from about 0.3 to about 1. The reflective material is reflective to substantially all wavelengths of visible light. The anode comprises at least one material selected from the group consisting of aluminum, silver, platinum, chromium and nickel. The anode comprises aluminum.

According to another embodiment, the electroluminescent device comprises: a cathode; an anode opposing the cathode, the anode comprises a substantially reflective material; and a functional layer located between the anode and cathode, the functional layer comprises a chemical compound of Formula I defined above. The substantially reflective material has a reflectivity from about 0.4 to about 1. The substantially reflective material is selected from the group consisting of aluminum, silver, gold, nickel, chromium, molybdenum, tantalum, titanium, and zinc. The substantially reflective material is reflective to substantially all of the wavelength components of visible light.

According to another embodiment, the electroluminescent device comprises: an anode formed substantially of a conductive material having a work function not greater than about 4.5 eV; a cathode electrode opposing the anode and formed substantially of a conductive material; at least one light-emitting layer located between the anode and cathode; wherein the anode is configured to inject holes in a direction toward the at least one light-emitting layer, whereas the cathode is configured to inject electrons in a direction toward the at least light-emitting layer; a buffer layer contacting either the anode or cathode on a side thereof toward the at least one light-emitting layer; and wherein the buffer layer is formed substantially of at least one substantially non-conductive material. The buffer layer contacts the anode. The anode comprises aluminum, and wherein the buffer layer comprises aluminum oxide. The device further comprises a hole-injecting layer located between the buffer layer and the at least one light-emitting layer, wherein the hole-injecting layer comprises a chemical compound of Formula I as defined above. The device further comprises another buffer layer contacting the cathode and located between the cathode and the at least one light-emitting layer. The buffer layer has a substantially small thickness sufficient to allow holes to pass therethrough. The buffer layer has a thickness from about 5 Å to about 40 Å. The buffer layer has a thickness from about 10 Å to about 20 Å.

In the above-described device, the at least one substantially non-conductive material is selected from the group consisting of aluminum oxide, titanium oxide, zinc oxide, ruthenium oxide, nickel oxide, zirconium oxide, tantalum oxide, magnesium oxide, calcium oxide, strontium oxide, vanadium oxide, yttrium oxide, lithium oxide, cesium oxide, chromium oxide, silicon oxide, barium oxide, manganese oxide, cobalt oxide, copper oxide, praseodymium oxide, tungsten oxide, germanium oxide, potassium oxide, lithium fluoride, magnesium fluoride, cesium fluoride, calcium fluoride, sodium chloride, potassium chloride, lithium metaborate ($BiBO_2$), potassium silicate ($K_2SiO_3$), silicon-germanium oxides, barium titanate, lithium tantalate ($LiTaO_3$), silicon nitride ($Si_3N_4$), boron nitride (BN), nitrides of elements in Family III or IV of the Periodic Table of the Elements, zinc sulfide (ZnS), cadmium sulfide (CdS), cadmium selenide (CdSe), gallium phosphide (GaP) and gallium nitride (GaN).

According to still another embodiment, the electroluminescent device comprises: an anode comprises an anode material; a cathodes comprises a cathode material; at least one layer between the anode and the cathode; and wherein the anode material has the work function less than or substantially equal to the work function of the cathode material. The anode material and the cathode material are the same. The at least one layer comprises a chemical compound of Formula I as described above. The at least one layer comprises a chemical compound of Formula Ia as defined above.

According to still another embodiment, the electroluminescent device comprises: an anode; a cathode; an anode contacting layer contacting the anode between the anode and cathode; a cathode contacting layer contacting the cathode between the anode and cathode; and means for forming a virtual electrode within at least one of the anode contacting layer and the cathode contacting layer.

Another aspect of the present invention provides various electronic displays. The displays comprises the above-described electroluminescent devices according to various embodiments. The displays further comprises an electronic circuit connected to the electroluminescent devices.

Another aspect of the present invention provides a method of operating an electronic device, comprises: providing an electronic device comprises an anode, a cathode and a functional layer between the anode and cathode, the functional layer having an interface with the anode or an intervening layer located between the anode and the functional layer; applying a forward bias electric power between the anode and cathode; and wherein electrons are injected from the anode into the functional layer and substantially stay in an area near the interface, thereby forming a virtual cathode.

In the above-described method, a continued application of the forward bias electronic power facilitates injection of holes from the anode into the functional layer. A continued application of the forward bias electronic power facilitates transportation of holes within the functional layer in a direction toward the cathode. The functional layer comprises a material having a reduction potential (low), electron mobility (low), hole mobility (high). The functional layer comprises a chemical compound of Formula I as described above. The functional layer comprises a chemical compound of Formula Ia as defined above. The functional layer comprises at least one chemical compound having a reduction potential ranged from about −0.4V to about 0 V. The functional layer comprises at least one chemical compound having a reduction potential ranged from about −0.3V to about 0 V. The anode comprises at least one material having a work function ranges from about 3.5 eV to about 4.5 eV. The functional layer comprises at least one chemical compound having an electron mobility therein lower than about $10^{-5}$ cm/V·s. The functional layer comprises at least one chemical compound having an electron mobility therein from about $10^{-10}$ cm/V·s to about $10^{-6}$ cm/V·s. The functional layer comprises at least one chemical compound having a hole mobility therein higher than about $10^{-4}$ cm/V·s. The functional layer comprises at least one chemical compound having a hole mobility therein from about $10^{-4}$ cm/V·s to about 1 cm/V·s.

DETAILED DESCRIPTION OF THE PREFERRED EMBODIMENT

Now the various aspects of the present invention will be discussed in more detail in terms of embodiments. It is to be understood at the outset of the description that persons of skill in the appropriate arts may modify the invention described here while still achieving the favorable results of this invention. Accordingly, the following description is to be understood as being a broad, teaching disclosure directed to persons of skill in the appropriate arts, and not as limiting upon the present invention. The headings used in the following description are merely to generally refer to the contents of their following discussions, but do not define or limit the contents of the discussions.

Constructions of Organic EL Devices

Organic EL devices in accordance with various embodiments of the present invention can be constructed in various ways. General construction of the organic EL devices includes two opposing electrodes and one or more functional layers interposed between the electrodes. The term "layer" refers to a deposit, coat or film of one material or a mixture of two or more materials. FIGS. 1-6 illustrate exemplary cross-sectional constructions of the organic EL devices that can embody various aspects of the present invention. In these drawings, the same reference numbers are used to indicate like layers or components among the constructions. It should be noted that these constructions are not exhaustive variants of the organic EL devices in accordance of the present invention.

The illustrated organic EL devices 10 has a substrate 1, an anode 3, a cathode 15 and one or more functional layers located between the anode 3 and the cathode 15. The one or more intervening functional layers include a hole-injecting layer 5, a hole-transporting layer 7, a light-emitting layer 9, an electron-transporting layer 11, an electron-injecting layer 13 and multi-functional layers having functions of two or more of the foregoing layers. A non-exhaustive list of the multi-functional layers includes a layer with hole-injecting and hole-transporting functions, a layer with hole-injecting and light-emitting functions, a layer with hole-injecting, hole-transporting and light emitting functions, a layer with electron-injecting and electron-transporting functions, a layer with electron-transporting and light-emitting functions, a layer with electron-injecting, electron-transporting and light-emitting functions, and so forth.

The substrate 1 (FIGS. 1-6) supports the laminated structure of the organic EL device 10. Although the drawings show that the substrate 1 is located on the side of the anode 3, the substrate 1 may be located on the side of the cathode 15. In either case, the substrate 1 provides a support on which the laminated construction of the organic EL device can be built during the manufacturing. The anode 3 (FIGS. 1-6) and cathode 15 (FIGS. 1-6) are electrically connected to an electric power source 17 (FIGS. 1-6) via a switch 19 (FIGS. 1-6), which is controlled by a controller (not shown). Although not illustrated, either or both of the electrodes 3 and 15 may be formed in multiple layers, which may or may not include a non-conductive layer, which is often called "a buffer layer". The hole-injecting layer 5 (FIGS. 1-3) is to facilitate the injection of holes from the anode 3 into the hole-transporting layer 7 (FIGS. 1-5). Similarly, the electron-injecting layer 13 (FIGS. 1 and 4) is to facilitate the injection of electrons from the cathode 15 into the electron-transporting layer 13. The hole-transporting layer 7 is to accelerate movement of holes away from the anode 3 and/or the hole-injecting layer 5 toward the light-emitting layer 9 (FIGS. 1-6). The electron-transporting layer 11 (FIGS. 1, 2, 4 and 5) is to accelerate movement of electrons away from the cathode 15 and/or the electron-injecting layer 13 toward the light-emitting layer 9 (FIGS. 1-6). With regard to the functional layers and other features of organic EL devices, refer to U.S. Patent Application Publication No. 2004/0023060 A1 of U.S. patent application Ser. No. 10/099,781, filed Mar. 14, 2002 and U.S. Patent Application Publication No. 2004/0067387 A1 of U.S. patent application Ser. No. 10/431,349, filed May 6, 2003, the publications of which are hereby incorporated herein by reference in their entirety.

When applying an appropriate electric voltage between the electrodes 3 and 15, electrons and holes are injected from the cathode 15 and anode 3, respectively, into intervening layer(s). The holes and electrons travel to and recombine at light-emitting molecules located in the intervening layer. Recombined pairs of electrons and holes, namely excitons, transfer the energy of the recombination to the light-emitting molecules where they recombined. Alternatively, excitons move around for a short period of time and transfer the recombination energy to other light-emitting molecules, particularly to those having a smaller band gap than the light-emitting molecules where they recombined. The transferred energy is used to excite valence electrons of the light-emitting molecules, which generates photons when the electrons return to their ground state.

Organic EL Devices Using Compound of Formula I

One aspect of the present invention provides organic EL devices containing at least one compound represented by Formula I in one or more of the functional layers between the two opposing electrodes 3 and 15.

Formula I

In Formula I, R1-R6 are independently chosen from the group consisting of hydrogen, halo, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—CO—OR), amide (—CO—NHR or —CO—NRR'), straight-chain or branched (substituted or unsubstituted) C$_1$-C$_{12}$ alkoxy, straight-chain or branched (substituted or unsubstituted) C$_1$-C$_{12}$ alkyl, aromatic or non-aromatic (substituted or unsubstituted) heterocyclic, substituted or unsubstituted aryl, mono- or di-(substituted or unsubstituted)aryl-amine, and (substituted or unsubstituted)alkyl-(substituted or unsubstituted)aryl-amine. In the foregoing substituent groups, R and R' are, for example, substituted or unsubstituted C$_1$-C$_{60}$ alkyl, substituted or unsubstituted aryl, substituted or unsubstituted 5-7 membered heterocyclic. The substituted C$_1$-C$_{60}$ alkyl, aryl and heterocyclic are optionally substituted with one or more of amine, amide, ether and ester groups. Alternatively, R1-R6 are independently selected from substituted or unsubstituted electron withdrawing substituent groups, which are well understood by those of ordinary skill in the art. The aryl group includes phenyl, biphenyl, terphenyl, benzyl, naphthyl, anthracenyl, tetracenyl, pentacenyl, perylenyl and coronenyl, which are singly or multiply substituted or unsubstituted.

Non-limiting examples of the Formula I compounds are shown below as Formula Ia through Formula If.

Formula Ia

Formula Ib

Formula Ic

Formula Id

Formula Ie

Formula If

Other examples of Formula I, synthesis of such compounds and various features of the compounds are further disclosed in U.S. Patent Application Publication No. US 2002/0158242 A1, and U.S. Pat. Nos. 6,436,559 and 4,780,536, all of which are hereby incorporated herein by reference in their entirety.

In an embodiment of the present invention, the organic EL device 10 includes at least one of the compounds of Formulas Ia-If. Optionally, at least one of the compound of Formulas Ia-If is contained in any of the layers singly or in combination with one or more compounds of Formula I or others. Still optionally, the compound of Formula Ia is contained in at least one of the layers of the organic EL device 10 singly or in combination with one or more other compounds, which may or may not be compounds represented by Formula I.

Figure 1:
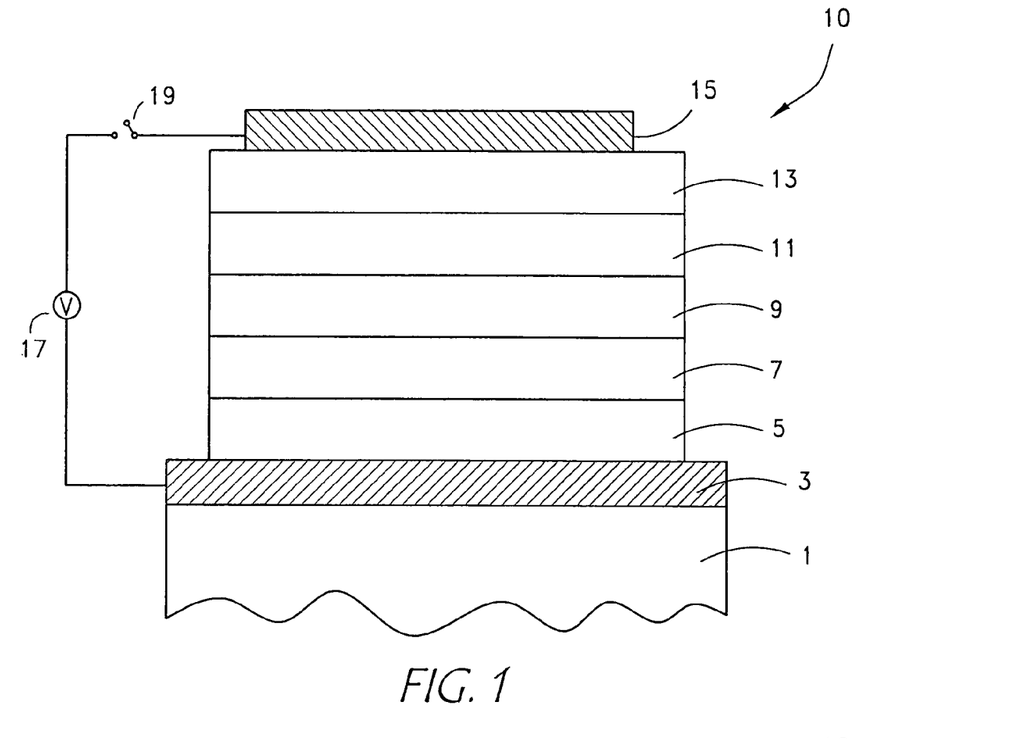
FIGS. 1-6 illustrate simplified cross-sectional views of organic EL devices in accordance with embodiments of the present invention.
Figure 2:
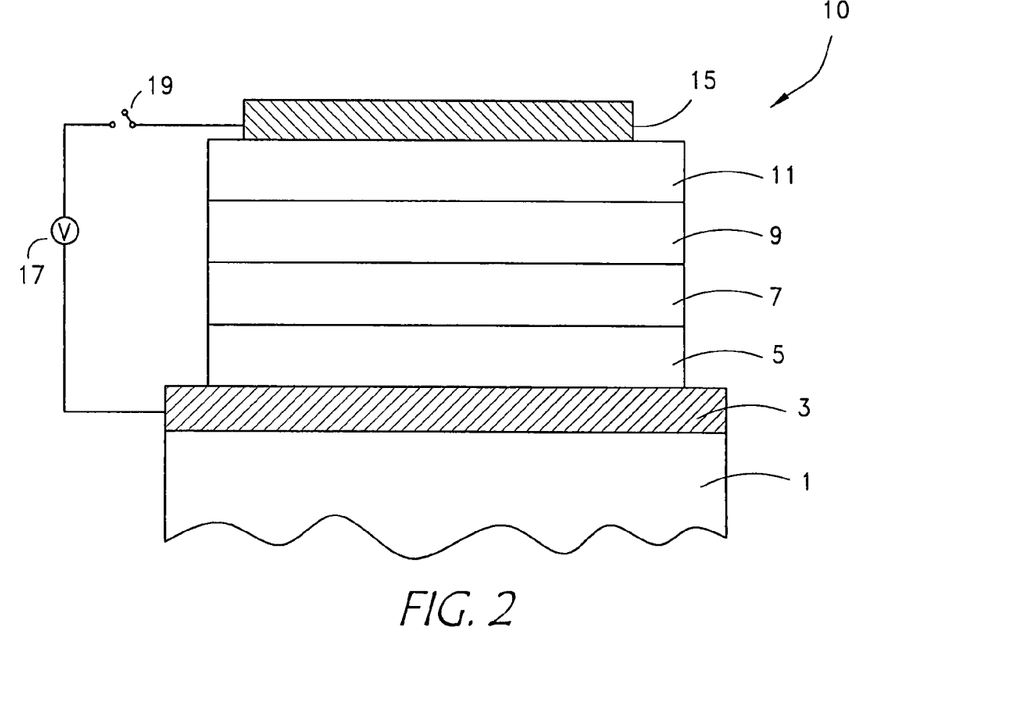
Figure 3:
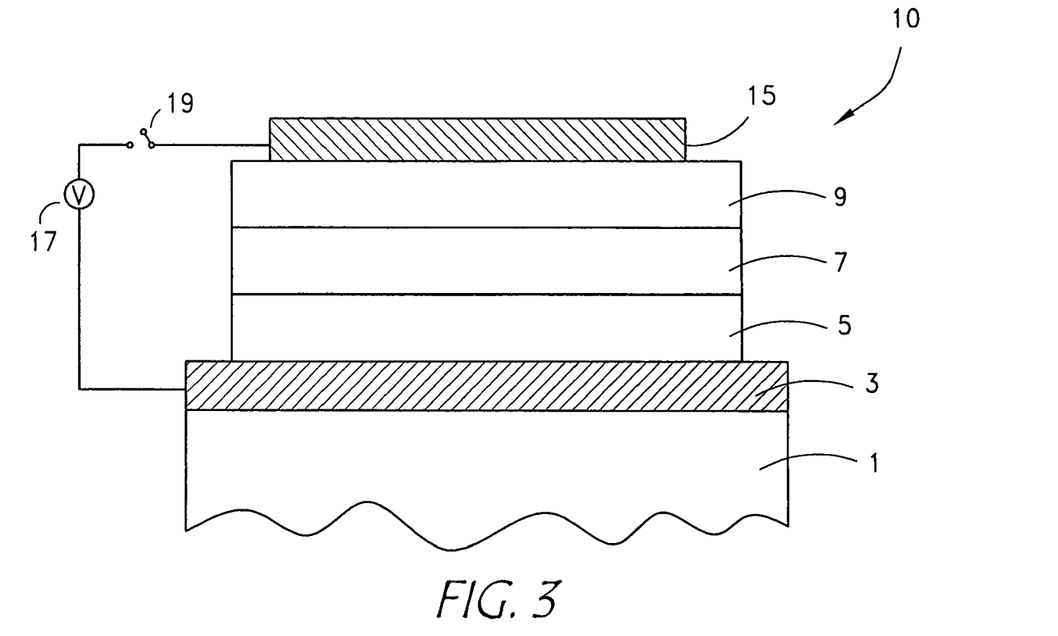
Figure 4:
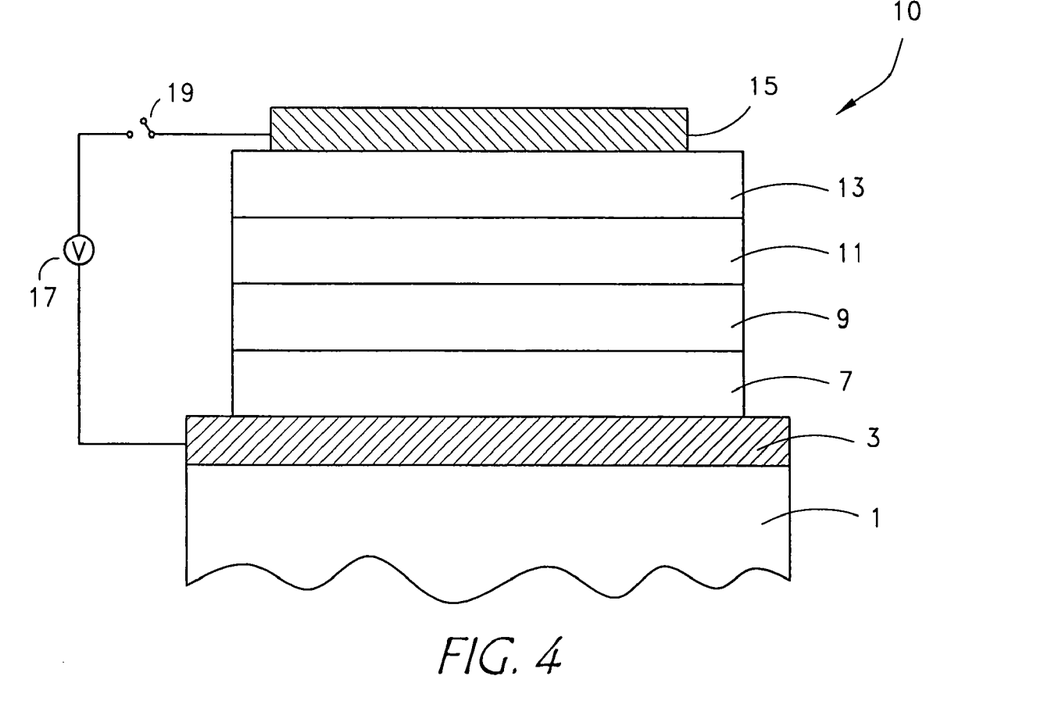
Figure 5:
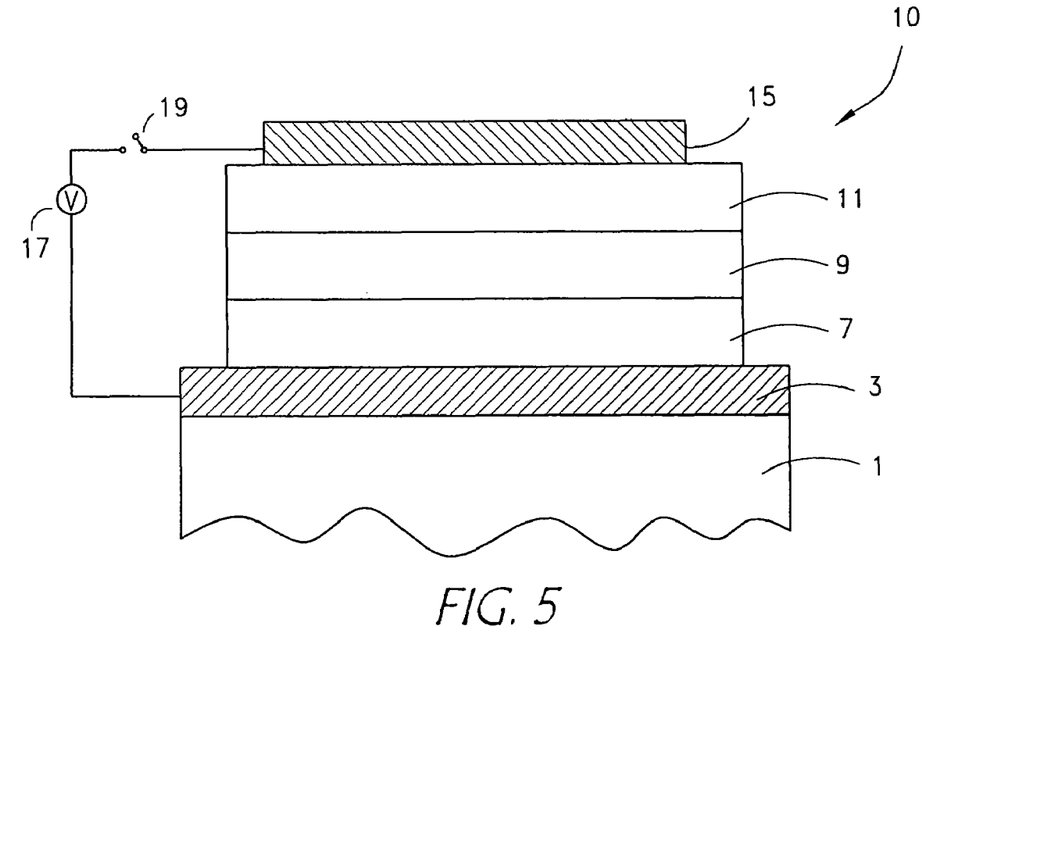
Figure 6:
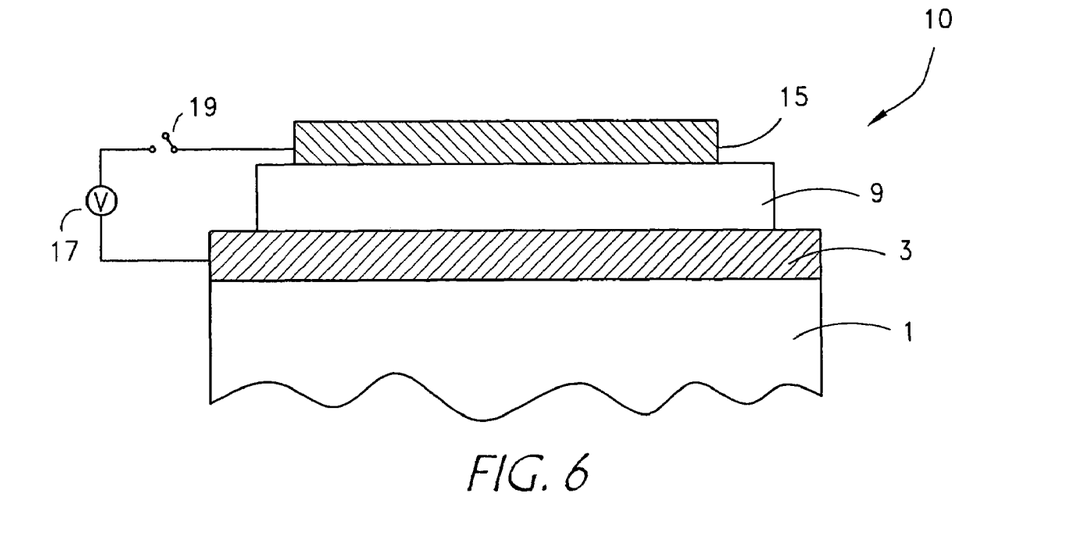

Generally, compounds of Formula I may be used in any of the functional or multi-functional layers of the organic EL device 10. Optionally, the compounds are those of Formula Ia-If. Optionally, one or more compounds represented by Formula I are contained in any of the layers contacting the anode 3. In one embodiment, the organic EL device includes a hole-injecting layer 5 as illustrated in FIGS. 1-3, and at least one of the compounds represented by Formula I is contained in that hole-injecting layer 5. Optionally, the hole-injecting layer is formed with at least one compound represented by Formula I substantially free of other materials. Alternatively, the hole-injecting layer is formed with at least one of the compounds represented by Formula I in combination with one or more other materials.

In another embodiment, the organic EL device includes a hole-transporting layer 7 as illustrated in FIGS. 1-5, and at least one of the compounds represented by Formula I is contained in the hole-transporting layer 7. Optionally, the compounds are those of Formula Ia-If. Optionally, the hole-transporting layer is formed with at least one compound of Formula I either substantially free of other materials or in combination with one or more other materials. In another embodiment, the organic EL device includes a layer for the functions including hole-injection and hole-transportation, and this multi-functional layer contains at least one compound represented by Formula I. This multi-functional layer is formed with at least one compound of Formula I either substantially free of other materials or in combination with one or more other materials.

Virtual Electrode

Another aspect of the present invention relates to formation of a virtual electrode in the operation of electronic devices including organic EL devices. The term "virtual electrode" is to refer to charge carrier accumulation in an internal area of an electronic device when it is viewed like an electrode from the perspective of a real electrode. The virtual electrode enhances or facilitates injection of the carriers from the real electrode.

Figure 7:
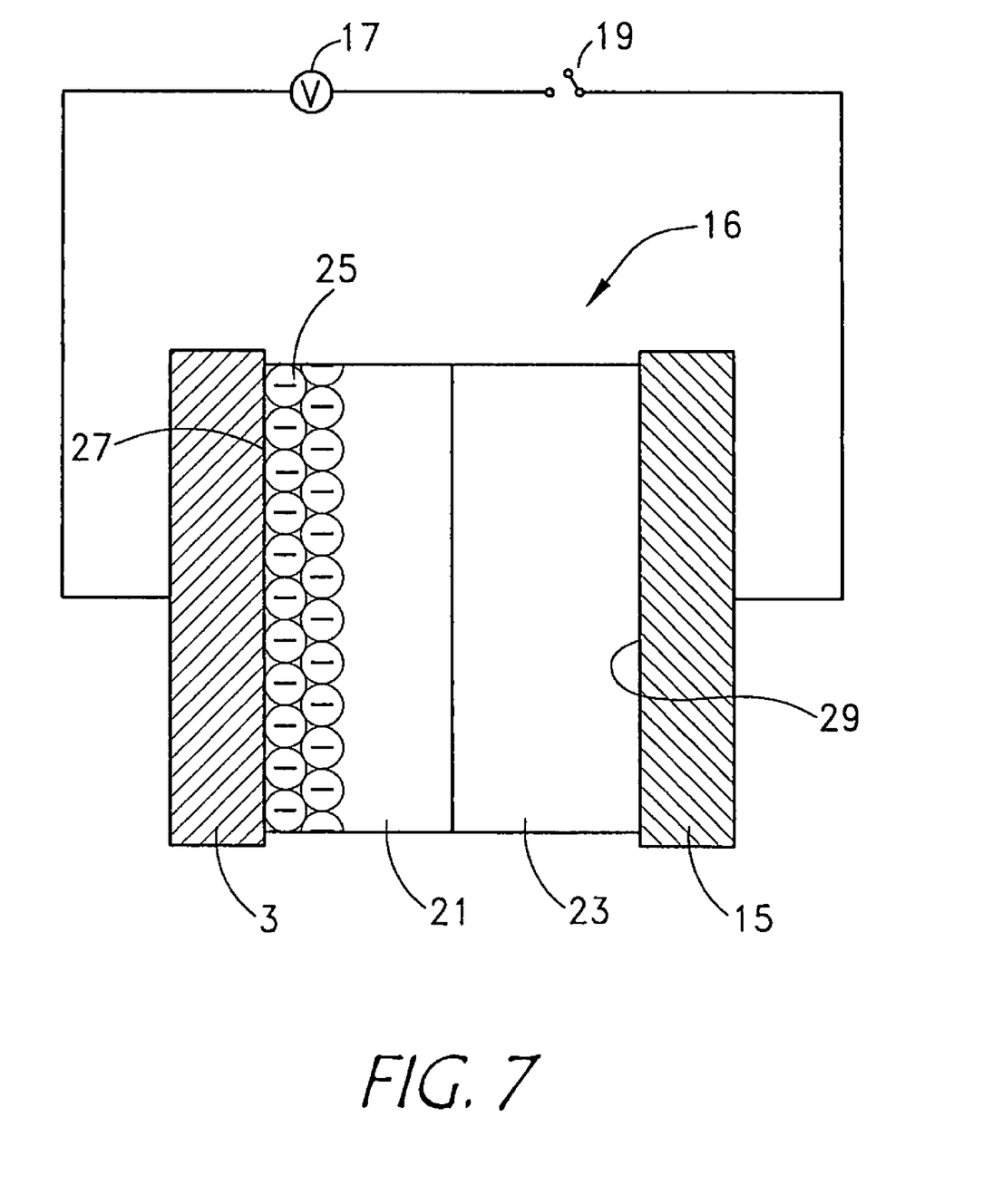
FIG. 7 illustrates formation of a virtual cathode in an electronic device in accordance with an embodiment of the present invention.

Now the formation of a virtual electrode is discussed with reference to an exemplary organic EL device 16 construction of FIG. 7. Although the discussion is in the context of EL devices, the virtual electrode is not a phenomenon unique only in organic EL devices, but can occur in any other electronic devices. The organic EL device 16 includes an anode 3 and a cathode 15 that are opposingly located. Each electrode 3 and 15 is connected to the power source 17 with a control switch 19. A first layer 21 and a second layer 23 are interposed between the opposing electrodes 3 and 15. At least one of the first and second layers 21 and 23 contain a light emitting material.

Without wishing to be bound for any theory of why the invention works, in one embodiment, the first layer 21 is made of a material that is more stable in its reduced state than its neutral state. Here, a material is more stable in its reduced state than its neutral state if the material spontaneously turns to its reduced state from its neutral state. Further suppose, for example, that electrons have very low mobility in the material of the first layer 21 while holes are high mobility therein. When the contact between the anode 3 and the first layer 21 is formed, free electrons of the anode 3 are transferred to the first layer 21 and for reduction of the material of the first layer 21. Because of poor electron mobility in the material, the transferred electrons hardly travel within the first layer 21 after crossing over the border 27 between the anode 3 and the first layer 21. Rather, the transferred electrons stay near the border 27 on the side of the first layer 21. Accordingly, the electrons transferred from the anode 3 to the first layer 21 accumulate along the border 27 as illustrated with referenced with number 25.

From the perspective of the anode 3, the accumulated electrons or negative charges 25 along the border 27 are viewed as if the source of electrons, that is, the cathode of the device, is located very close to the border 27 because of the abundance of negative charges. In that sense, the area of the accumulated electrons 25 is called a virtual cathode. When applying a forward bias between the electrodes 3 and 15 by the operation of the switch 19, the anode 3 injects holes toward the virtual cathode 25 and therefore toward the first layer 21. The closeness of the negative charges of the virtual cathode from the anode 3 facilitates the injection of holes from the anode 3. The holes injected into the first layer 21 moves forward in the direction toward the real cathode 15 or the second layer 23 with the momentum of the injection from the anode 3 and with the forward bias between the two electrodes 3 and 15. The high hole mobility of the material for the first layer 21 helps the transportation of the holes in the direction toward the real cathode 15 or the second layer 23.

A similar phenomenon may occur in the second layer 23 to form a virtual anode by accumulation of holes along the border 29 between the cathode 15 and the second layer 23. The material for the second layer 23 are selected from those which are more stable in its oxidized state than its neutral state, and have low hole mobility and high electron inability therein. Holes are transferred from the cathode 15 to the second layer 23 and accumulate near the border between the cathode 15 and the second layer 23. The accumulated holes are viewed as a virtual anode from the perspective of cathode 15. Upon application of an appropriate electric power in a forward bias, the cathode 15 will inject electrons into the second layer 23.

In accordance with various embodiments of the present invention, charge carriers accumulate in an internal area of the device to form a virtual electrode. In the organic EL device 16 (FIG. 7), for example, the first layer 21 may constitute a hole-injecting layer, a hole-transporting layer, a light-emitting layer or a multi-functional layer with the functions of the foregoing layers. Alternatively, the first layer 21 may not exist, and the anode 3 contacts the second layer 23. The second layer 23 may constitute, for example, a hole-transporting layer, a light-emitting layer, an electron-transporting layer, an electron-injecting layer or a multi-functional layer with one or more functions of the foregoing layers. Alternatively, the second layer 23 may not exist, and the cathode 15 contacts the first layer 21. Although the phenomenon is discussed in terms of the organic EL device having one or two of the layers 21 and 23, the same applies in any other constructions of organic EL devices, for example, having more than two layers interposed between the anode 3 and cathode 15.

In the embodiment of the organic EL device forming a virtual electrode, the first layer 21 contains a chemical compound which is more stable in its reduced state than its neutral state. Optionally, such a chemical compound is selected from the compounds represented by Formula I. Preferably, the first layer contains the compound of Formula Ia. In another embodiment, a chemical compound for the first layer 21 has a reduction potential from about −0.6 Volts (V) to about 0 V, preferably, from about −0.2 V to about 0 V. Alternatively, the reduction potential of the compound for the first layer 21 is from about −0.3 V to about 0 V, optionally from about −0.1 to about 0 V. The first layer 21 contains a chemical compound, in which electrons have low mobility while holes have high mobility. The compound for the first layer 21 has electron mobility equal to or lower than about $10^{-5}$ cm/V·s, preferably from about $10^{-10}$ cm/V·s to about $10^{-6}$ cm/V·s. The compound for the first layer 21 has hole mobility equal to or higher than about $10^{-4}$ cm/V·s, preferably from about $10^{-4}$ cm/V·s to about 1 cm/V·s.

In an embodiment of the organic EL device forming a virtual electrode, the second layer 23 contains a chemical compound, which is more stable in its oxidized state than its neutral state. In another embodiment, the second layer 23 contains a chemical compound for the second layer 23 has an oxidation potential equal to or lower than about 0.5 V. Alternatively, the oxidation potential of the compound is from about 0 to about 0.4 V, preferably, from about 0 to about 0.3 V. The second layer 23 contains a chemical compound, in which holes have low mobility while electrons have high mobility. The compound for the second layer 23 has hole mobility equal to or lower than about $10^{-4}$ cm/V·s, preferably from about $10^{-10}$ cm/V·s to about $10^{-5}$ cm/V·s. The compound for the second layer 23 has electron mobility equal to or higher than about $10^{-5}$ cm/V·s, preferably from about $10^{-5}$ cm/V·s to about 1 cm/V·s.

Work-Function of Electrode Materials

Another aspect of the present invention relates to use of a material having a low work function in the anode 3. It has been general knowledge in the relevant art that materials for an anode are selected from those having a relatively high work function; on the other hand, materials for a cathode are selected from those having a relatively low work function. In accordance with an embodiment of the present invention, however, an organic EL device has an anode, the material of which has a relatively low work function. For example, the work function of the anode material is below about 4.5 eV, preferably below about 4.3 eV. Alternatively, the work function of the anode material. is from about 3.5 eV to about, 4.5 eV, preferably from about 3.8 eV to about 4.3 eV. The materials for use in an anode includes, for example, aluminum (Al, 4.28 eV), silver (Ag, 4.26 eV), zinc (Zn, 4.33 eV), niobium (Nb, 4.3 eV), zirconium (Zr, 4.05 eV), tin (Sn, 4.42 eV), tantalum (Ta, 4.25 eV), vanadium (V, 4.3 eV), mercury (Hg, 4.49 eV), gallium (Ga, 4.2 eV), indium (In, 4.12 eV), cadmium (Cd, 4.22 eV), boron (B, 4.4 eV), hafnium, (Hf, 3.9 eV), lanthanum (La, 3.5 eV), niobium (Nb, 4.3 eV), titanium (Ti, 4.3 eV) or alloys of one of above metals with neodymium (Nd) or palladium (Pd).

One possible, but non-limiting explanation for the use of a relatively low work-function material in an anode is that the low work-function anode material helps formation of the above-described virtual cathode. Referring back to FIG. 7, the low work-function material of the anode 3 easily transfers electrons to the first layer 21 upon formation of the contact between the anode 3 and the first layer 21. The electron transfer from the anode 3 to the first layer 21 is enhanced upon application of an appropriate voltage. The electrons transferred into the first layer 21 form the virtual cathode 25, which enhances the hole injection from the anode 3 into the first layer 21 and in the direction toward the real cathode 15 as described above.

According to an embodiment of the present invention, the work function of the cathode material is below about 4.5 eV. The materials for use in the cathode 15 include, for example, magnesium, calcium, sodium, potassium, titanium, indium, yttrium, lithium, gadolinium, aluminum, silver, tin, lead, similar metals, CsF, alloys containing one or more of the foregoing metals, or multiple layers containing one or more of the foregoing metals including LiF/Al and $Li_2O$/Al. Either transparent or non-transparent materials may be used for the cathode 15, depending upon the construction of the light passage in the organic EL device as discussed above. Those of ordinary skill in the art would appreciate any other materials that can be used in the cathode 15 and also the selection of appropriate cathode materials.

According to an embodiment of the present invention, the anode 3 has a single layered construction formed of a single material, which can be a substantially pure elemental material or a homogeneous or non-homogeneous alloy. In another embodiment, the anode 3 may include multiple sublayers, which may or may not include a non-conductive sublayer. Optionally, the discussion above of the work function of anode materials apply only to conductive part of the anode 3, not to a non-conductive sublayer or part thereof. Optionally, the anode 3 may have one or more conductive material sublayers. In the case of the anode construction including multiple conductive material sublayers, the discussion above of the work function of anode materials applies to at least one of the conductive materials.

Another aspect of the present invention relates to use of a material having a high work function in the cathode 15. Just like the low work-function anode, the high work-function cathode material helps formation of the above-described virtual anode. In accordance with an embodiment of the present invention, an organic EL device 10 has a cathode 15, the material of which has a high work function. For example, the work function of the cathode material is above about 3.5 eV, preferably above about 4 eV. Alternatively, the work function of the cathode material is from about 4.1 eV to about 5.0 eV, preferably from about 4.1 eV to about 4.8 eV.

Reflective Materials for Anode

Another aspect of the present invention relates to the use of reflective material in the anode 3 of an organic EL device. In an embodiment of the organic EL device according to the present invention, the anode is formed with one or more materials having high reflectivity. For example, the reflectivity as a ratio of a reflected light intensity to an inputted light intensity is above about 0.2, for example from about 0.4 to about 1. Reflective materials for use in the anode 3 include, for example, aluminum, silver, gold, nickel, chromium, molybdenum, tantalum, titanium, and zinc. Optionally, the materials have the reflectivity to substantially all of the wavelength components of visible light. Optionally, the materials have substantially even reflectivity to substantially all of the wavelength components of visible light. Preferably, the reflective anode materials are, for example, aluminum, silver, platinum, chromium and nickel.

In an embodiment of the present invention, the anode 3 may include a plurality of sublayers. Optionally, the anode 3 may be formed of at least one transparent sublayer and a reflective sublayer. The at least one transparent sublayer may be formed with transparent materials, for example, including ITO (indium tin oxide), IZO (indium zinc oxide), and fluorinated tin oxide. The reflective sublayer is formed with one or more reflective materials as described above. As an alternative embodiment, the anode 3 is a single layer made of a reflective material. The single layer construction of the anode is advantageous over the multi-sublayer construction in terms of the simplicity in the manufacturing process.

Top Emission

In the constructions of FIGS. 1-6 where the anode 3, not the cathode 15, contacts the substrate 1, the use of reflective material in the anode 3 allows the generated light to emit through the cathode 15 or in a direction other than through the anode 3. In the same constructions of FIGS. 1-6, the emission through the cathode 15 is referred to as top emission; on the other hand, the emission through the anode 3 and substrate 1 is referred to as bottom emission. Optionally, the organic EL device 10 may be constructed in the top emission design. For top emission, the cathode 15 is substantially transparent.

In one embodiment, the substantially transparent cathode 15 is formed in a single layer of one or more transparent conductive materials. Examples of the transparent conductive materials include ITO (indium tin oxide), IZO (indium zinc oxide) and fluorinated tin oxide. Alternatively, the substantially transparent cathode 15 is formed in multiple layers (not shown). For example, the cathode 15 in the multiple layer construction may include a thin layer made of a normally non-transparent material and a transparent material layer. The thin layer of the normally non-transparent material is formed in a thickness through which the visible light emitted from an organic EL material can pass. Optionally, the thickness of the thin layer is from about 10 Å to about 500 Å, preferably from about 10 Å to about 200 Å. The normally non-transparent materials for use in the thin layer include, for example, magnesium (Mg), calcium (Ca), lithium (Li), aluminum (Al), indium (In), potassium (K), yttrium (Y), strontium (St), europium (Eu), sodium (Na), gallium (Ga), samarium (Sm) or an alloy or mixture of two or more of the foregoing elements. The transparent material layer is made of one or more materials, which are, for example, indium tin oxide (ITO), indium zinc oxide (IZO) and fluorinated tin oxide. The thickness of the transparent material layer is from about 100 Å to about 5000 Å. The cathode 15 in the multiple layer construction may further include one or more additional layers.

Location and Kind of Control Circuits

Figure 8:
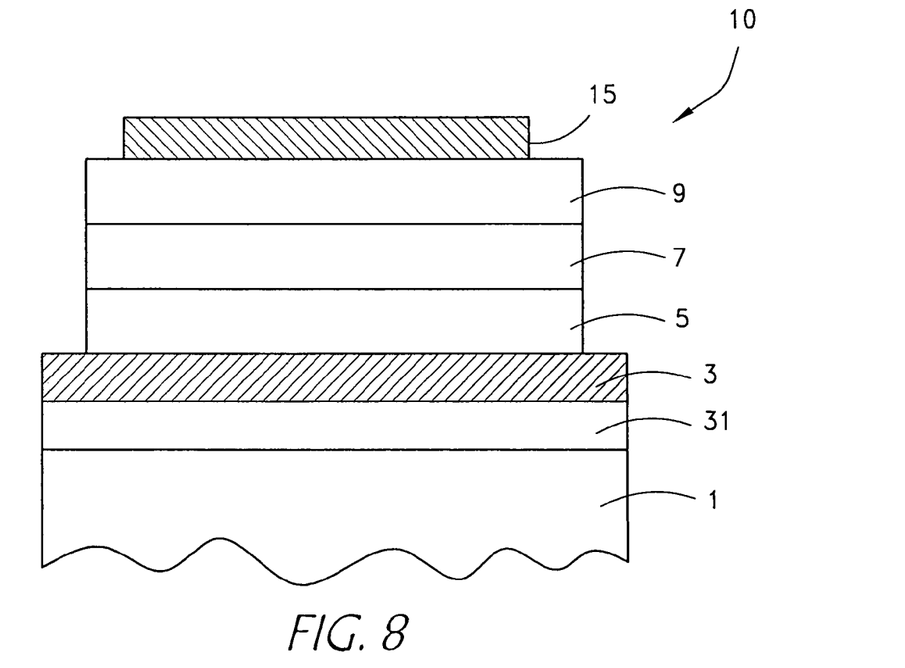
FIG. 8 illustrates a simplified cross-sectional view of an active matrix driven organic EL device-in accordance with an embodiment of the present invention.

The top emission design of organic EL devices is generally more compatible with active matrix driving of the devices than the bottom emission design. The active matrix driving requires a layer 31 for a transistor or an integrated circuit between the substrate 1 and the anode 3 as illustrated in FIG. 8. In organic EL devices with the bottom emission design, the integrated circuit layer 31 will block at least some of the light emitted from the light-emitting compound. However, the top emission design would not be affected by the existence of the integrated circuit layer 31 below the anode 3. Nor would the top emission design be affected by the technology of forming the integrated circuit layer 31, for example use of amorphous silicon or polysilicon, which affects the aperture ratio of the layer 31.

In the embodiment of top emission design, the organic EL devices utilize either passive matrix or active matrix circuit design. Optionally, the top emission design utilizes active matrix circuit design. Still optionally, the integrated circuit for the active matrix driving is formed between the substrate 1 and the anode 3. Still optionally, the integrated circuit is formed with the amorphous silicon technology.

Sealing Layer

In certain embodiments of organic EL devices, it is advantageous to have a sealing layer between the substrate 1 and the anode 3 to prevent moisture or other contaminating substances from permeating into the intricate area of laminated structure. Such a sealing layer is more important particularly when the material for the substrate 1 is more permeable. The sealing layer is often made with one or more substantially non-permeable or semi-permeable materials. Such materials are, for example, aluminum, aluminum oxide, strontium oxide, barium oxide, silicon oxide, silicon nitride. The sealing layer may be constructed in multiple layers including at least one organic sub-layer and at least one inorganic sub-layer. An organic subs-layer may be formed with, for example, polyphenylethylene, polymerized epoxy compounds and/or polycyclicalkane. An inorganic sub-layer may be formed with, for example, silicon nitride, silicon oxide and/or barium oxide. To the extent that the substantially non-permeable or semi-permeable material can also be used as an anode material, the anode 3 itself forms the sealing layer. Thus, no separate sealing layer need to be formed. In an embodiment of the present invention, the anode 3 is made of aluminum, aluminum-neodymium alloy or aluminum-palladium alloy, which functions as sealing layer as well. The anode 3 that also functions as a sealing layer is used together with any appropriate substrate materials with or without intervening integrated circuit layer 31 between the substrate 1 and the anode 3.

Non-Conductive Sublayer of Anode

Figure 9:
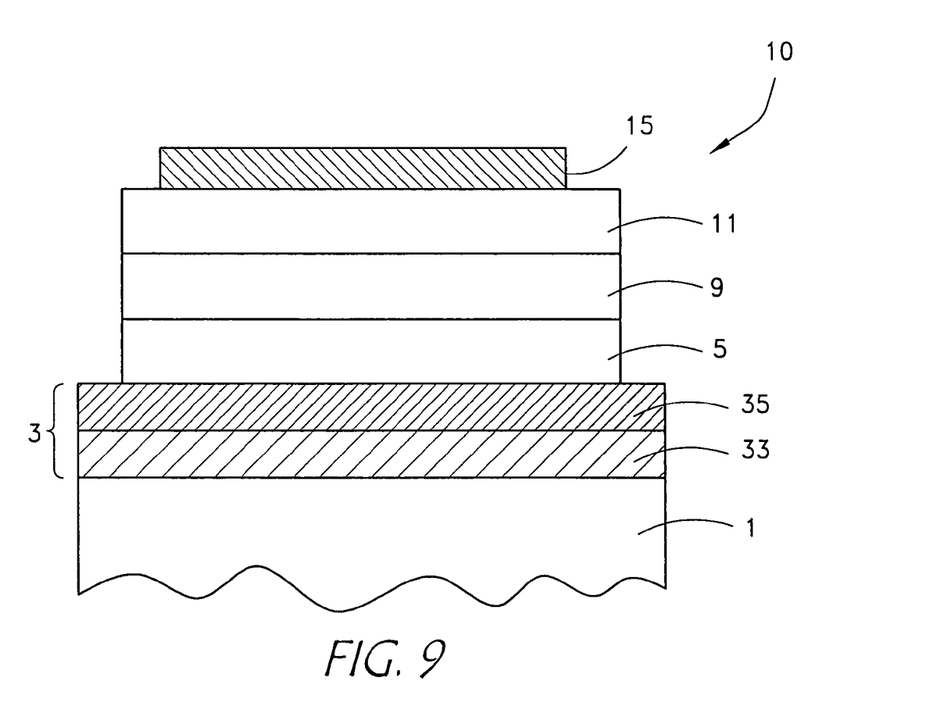
FIG. 9 illustrates a simplified cross-sectional view of an organic EL device employing a non-conductive sublayer in its anode in accordance with an embodiment of the present invention.

In any organic EL device embodiments of present invention, either or both of the anode 3 and cathode 15 may be formed in multiple sublayers. Referring to FIG. 9, for example, the anode 3 of the illustrated organic EL device includes a conductive sublayer 33 and a non-conductive sublayer 35. Although shown in two sublayers, the anode 3 may have more than two sublayers. As illustrated, the non-conductive sublayer 35 is located between the conductive sublayer 33 and the hole-injecting layer 5, which contacts the anode 3 on its side toward the cathode 15. The hole-injecting layer 5 in this laminated anode construction can be substituted for a hole-transporting layer 7 (FIGS. 4 and 5), a light-emitting layer 9 (FIG. 6) or a multi-functional layer (not shown). In the alternative, the non-conductive sublayer 35 may be considered as a separate layer inserted between the anode 3 and the layer 5, 7 or 9 contacting the anode 3.

Considered as a separate layer, the non-conductive sublayer 35 may be referred to as a buffer layer. Regardless of its name, the non-conductive sublayer or buffer layer 35 is formed to improve interfacial strength between the conductive sublayer 33 (or anode 3) and the layer 5, 7 or 9 contacting the anode 3. The non-conductive sublayer or buffer layer 35 also help lowering the energy barrier for the injection of holes from the conductive sublayer 33 into the layer 5,7, or 9 contacting the non-conductive sublayer 35. In an embodiment, the non-conductive sublayer or buffer layer 35 is formed with one or more inorganic materials. Optionally, the materials for the buffer layer include, for example, aluminum oxides, titanium oxides, zinc oxides, ruthenium oxides, nickel oxides, zirconium oxides, tantalum oxides, magnesium oxides, calcium oxides, strontium oxides, vanadium oxides, yttrium oxides, lithium oxides, cesium oxides, chromium oxides, silicon oxides, barium oxides, manganese oxides, cobalt oxides, copper oxides, praseodymium oxides, tungsten oxides, germanium oxides, potassium oxides, lithium fluoride, magnesium fluoride, cesium fluoride, calcium fluoride, sodium chloride, potassium chloride, lithium metaborate ($BiBO_2$), potassium silicate ($K_2SiO_3$), silicon-germanium oxides, barium titanate, lithium tantalate ($LiTaO_3$), silicon nitride ($Si_3N_4$), boron nitride (BN), nitrides of elements in Family III or IV of the Periodic Table of the Elements, zinc sulfide (ZnS), cadmium sulfide (CdS), cadmium selenide (CdSe), gallium phosphide (GaP), gallium nitride (GaN) and combinations of two or more of the foregoing materials.

Manufacturing the Device

Various layers of the organic EL devices of the present invention can be produced by utilizing any film forming techniques, including sputtering, electron beam vapor deposition, other types of physical vapor depositions (PVD), chemical vapor deposition (CVD), spin coating, dip coating, doctor blading, inkjet printing, screen-printing, roll-coating and thermal transfer. These techniques are generally described in the following publications, which are hereby incorporated herein by reference: *Applied Physics Letters,* 73, 18, 1998, 2561-2563; *Applied Physics Letters,* 78, 24, 2001, 3905-3907. Persons of ordinary skill in the art would appreciate the appropriate film forming techniques under the conditions and circumstances for the formation of such layers.

EXAMPLES

Various aspects and features of the present invention will be further discussed in terms of the examples. The following examples are intended to illustrate various aspects and features of the present invention but not to limit the scope of the present invention.

Example 1

A glass substrate (Corning 7059) was coated with about 1300 Å indium tin oxide (ITO) and was ultrasonically cleaned in an aqueous solution of a cleaning agent from Fischer Co. The cleaned ITO layered substrate was dried and transferred to a plasma cleaning device. The substrate was further cleaned with argon-oxygen (2:1) plasma at 50 W under 14 m ton for 5 minutes. The substrate was then transferred to a vacuum vapor deposition chamber.

About 100 Å of aluminum layer is deposited on the ITO layer by thermal vacuum vapor deposition to form a semitransparent aluminum anode. The aluminum layer is exposed to oxygen gas under atmospheric pressure for 5 minutes to form an aluminum oxide layer of about 20 Å. A hole-injecting layer of the compound of Formula Ia (hexanitrile hexaazatriphenylene or HAT) was formed over the aluminum oxide layer at about 500 Å by thermal vacuum deposition. Over the hole-injecting layer, a hole-transporting layer was formed with NPB at about 400 Å by thermal vacuum deposition. Over the hole-transporting layer, a light-emitting layer was formed with Alq3 at about 300 Å by thermal vacuum deposition. Over the light-emitting layer, an electron-transporting layer was formed with the compound of Formula II (2-[4-[(N-phenyl-benzimidazol-2-yl)phenyl-9,10-bis(2-naphthyl)anthracene] at about 200 Å by thermal vacuum deposition. For the cathode, a layer of about 10 Å of lithium fluoride (LiF) was formed over the electron-transporting layer, and then a layer of about 2500 Å aluminum was further deposited. During the deposition, the pressure within the deposition chamber was maintained at $5-8 \times 10^{-7}$ torr. The organic materials were deposited at the speed of 1 Å/sec. The lithium fluoride was deposited at the speed of 0.3 Å/sec, and the aluminum was deposited at a speed of 3-7 Å/sec.

Formula II

The resulting laminated structure of the organic EL device was represented as "Glass substrate/ITO(1300 Å)/Al (100 Å)/Al$_2$O$_3$(20 Å)/HAT(500 Å)/NPB(400 Å)/Alq3 (300 Å)/Formula II(200 Å)/LiF(10 Å)/Al(2500 Å)." When 5.17 V of forward bias was applied across the resulting device, 500 nit of emission was observed through the semitransparent aluminum layer. The color of the emission was identified as x=0.460, y=0.550 in the 1931 CIE color coordination. The current density during the operation was 50 mA/cm$^2$.

Example 2

A device was fabricated in the same manner as in Example 1 except that the ITO layer was not formed and that the Al$_2$O$_3$ layer was not formed. The resulting structure was represented as "Glass substrate/Al(100 Å)/HAT(500 Å)/NPB (400 Å)/Alq3(300 Å)/Formula II(200 Å)/LiF(10 Å)/Al (2500 Å)."

When 5.0 V of forward bias was applied across the resulting device, 1,010 nit of emission was observed through the semitransparent aluminum layer. The color of the emission was identified as x=0.417, y=0.534 in the 1931 CIE color coordination. The current density during the operation was 50 mA/cm$^2$.

Example 3

Comparative Example 1

A device was fabricated in the same manner as in Example 1 except that the hole-injection layer of HAT was not formed. The resulting structure of the device was represented as "Glass substrate/ITO(1300 Å)/Al(100 Å)/Al$_2$O$_3$(20 Å)NPB (400 Å)/Alq3(300 Å)/Formula II(200 Å)/LiF(10 Å)/Al (2500 Å)." No emission was observed even when applying over 20 V forward bias to the device. The current density during the application of the forward bias was less than 0.1 mA/cm$^2$.

Example 4

Comparative Example 2

A device was fabricated in the same manner as in Example 1 except that the aluminum and aluminum oxide layers between the ITO and NPB were not formed. The resulting structure was represented as "Glass substrate/ITO (1300 Å)/HAT(500 Å)/NPB(400 Å)/Alq3(300 Å)/Formula II (200 Å)/LiF(10 Å)/Al(2500 Å)." When 5.37 V of forward bias was applied across the resulting device, green emission of the color x=0.345, y=0.553 of the 1931 CIE color coordination was observed. The current density during the operation was 50 mA/cm². At 100 mA/cm² of constant DC current density, it took 23 hours until the brightness drops to 80% level of the initial brightness of 3399 nit.

Example 5

A device was fabricated in the same manner as in Example 1 except that 100 A thickness of silver was formed as a semitransparent anode instead of aluminum and aluminum oxide. The resulting structure of the device was represented as "Glass substrate/ITO(1300 Å)/Ag(100 Å)/HAT(500 Å)/NPB (400 Å)/Alq3(300 Å)/Formula II(200 Å)/LiF(10 Å)/Al (2500 Å)." When 5.1 V of forward bias was applied across the resulting device, observed was 800 nit of emission of the color x=0.420, y=0.516 of the 1931 CIE color coordination. The current density during the operation was 50 mA/cm².

Example 6

A device is fabricated in the same manner as in Example 5 except that the ITO layer is not formed. The resulting structure is represented as "Glass substrate/Ag(100 Å)/HAT (500 Å)/NPB(400 Å)/Alq3(300 Å)/Formula II(200 Å)/LiF (10 Å)/Al(2500 Å)."

When a forward bias is applied across the resulting device, visible light is observed.

Example 7

A glass substrate (Corning 7059) coated with about 1300 Å indium tin oxide (ITO) was ultrasonically cleaned in an aqueous solution of a cleaning agent from Fischer Co. The cleaned ITO layered substrate was dried and transferred to a plasma cleaning device. The substrate was further cleaned with argon-oxygen (2:1) plasma at 50 W under 14 m tort for 5 minutes. The substrate was then transferred to a vacuum vapor deposition chamber.

The compound of Formula Ia (hexanitrile hexaazatriphenylene or HAT) was formed over the ITO layer at about 2000 Å by thermal vacuum deposition. Over the compound layer, about 500 Å aluminum was deposited to form cathode. During the deposition, the pressure within the deposition chamber was maintained at $5-8 \times 10^{-7}$ torr.v. The organic materials were deposited at the speed of 1 Å/sec and the aluminum was deposited at a speed of 3-7 Å/sec.

Figure 10:
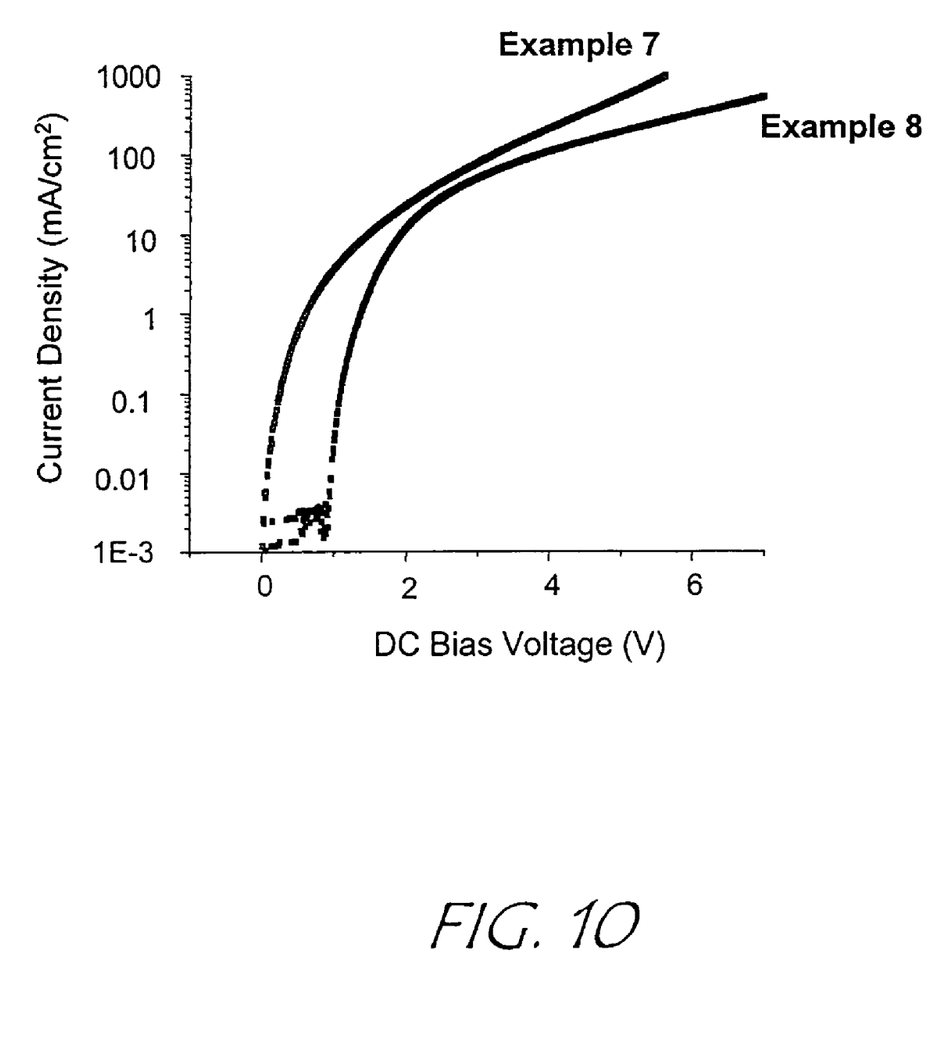
FIG. 10 illustrates voltage-current relationship in the operation of the devices of Examples 7 and 8.

The resulting laminated structure of the organic EL device was represented as "Glass substrate/ITO(1300 Å)/HAT (2000 Å)/Al(500 Å)." When a forward bias was applied across the device, electric current was observed at a potential difference just above 0 V. The voltage-current relationship was shown in FIG. 10.

Example 8

Comparative Example 3

A device was fabricated in the same manner as in Example 7 except that 1600 Å thickness of NPB was formed instead of HAT. The resulting structure of the device was represented as "Glass substrate/ITO(1300 Å)/NPB(1600 Å)/Al(500 Å)." When a forward bias was applied across the device, electric current was observed at. a potential difference about 1 V. The voltage-current relationship was also shown in FIG. 10.

Example 9

Figure 11:
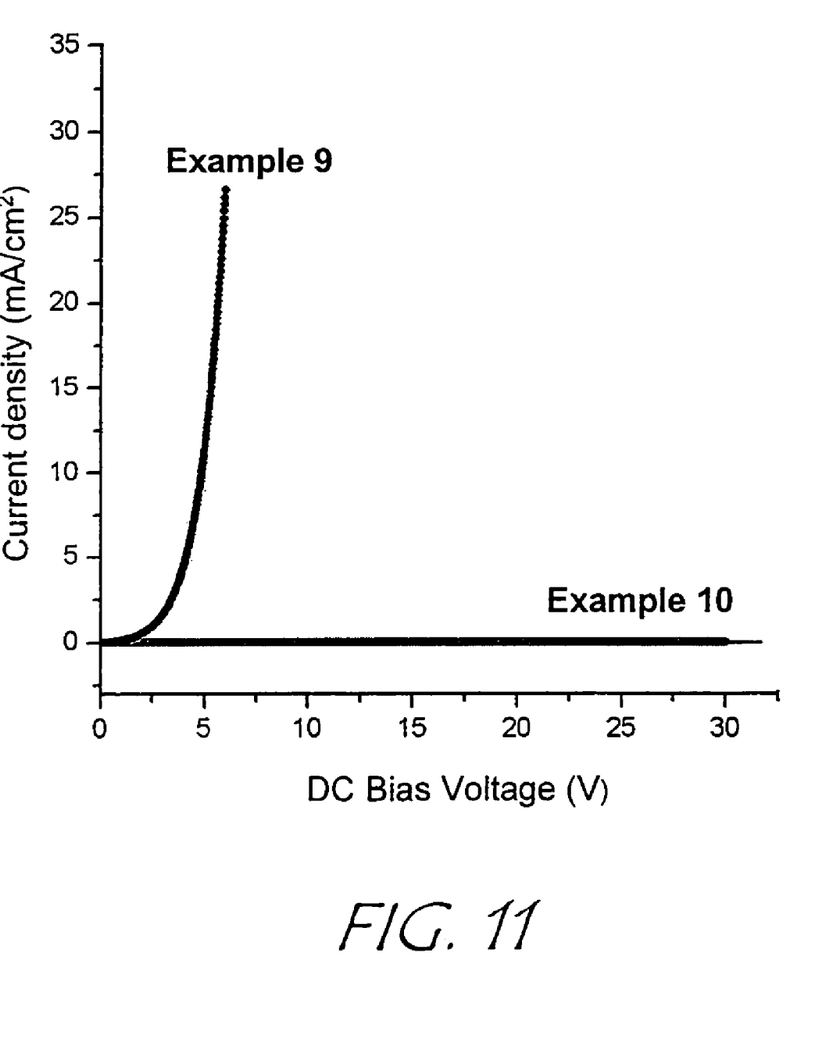
FIG. 11 illustrates voltage-current relationship in the operation of the devices of Examples 9 and 10.

A device was fabricated in the same manner as in Example 7 except that 500 Å aluminum layer was formed as an anode in lieu of the ITO layer. The resulting structure was represented as "Glass substrate/Al(500 Å)/HAT(2000 Å)/Al (500 Å)." When a forward bias was applied across the device, electric current was observed at a potential difference just above 0 V. The voltage-current relationship was shown in FIG. 11.

Example 10

Comparative Example 4

A device was fabricated in the same manner as in Example 9 except that 2000 Å thickness of NPB was formed instead of HAT. The resulting structure of the device was represented as "Glass substrate/Al(500 Å)/NPB(2000 Å)/Al(500 Å)." When a forward bias was applied across the device, no electric current was observed even at a potential difference over 20 V. The voltage-current relationship was also shown in FIG. 11.

Example 11

Figure 12:
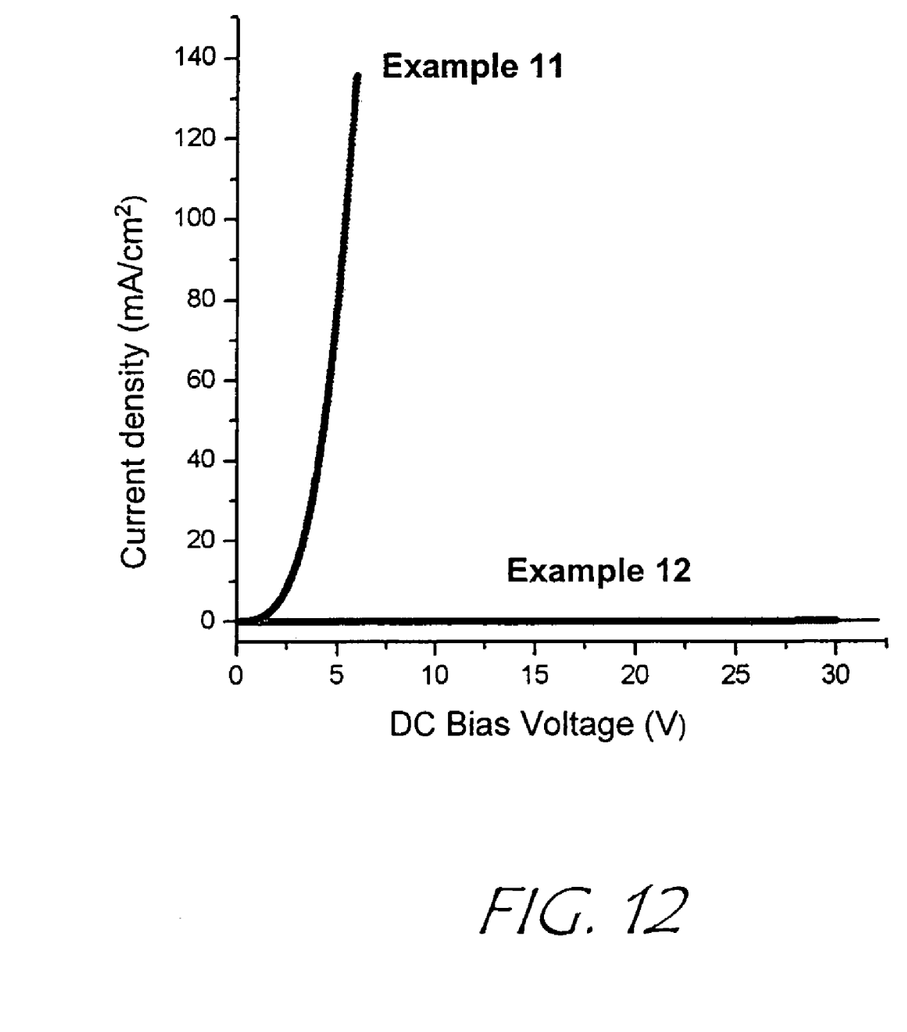
FIG. 12 illustrates voltage-current relationship in the operation of the devices of Examples 11 and 12.

To the device fabricated in the Example 9 having the construction of "Glass substrate/Al(500 Å)/HAT(2000 Å)/Al (500 Å)," an electric potential was applied with the opposite polarity to that of Example 9, in which the aluminum located between the glass substrate and HAT layer acted as a cathode, and the aluminum located above the HAT acted as an anode. Upon the application of the forward bias, the current started to flow just above 0 V. The voltage-current relationship was also shown in FIG. 12. The result in combination with that of Example 9 indicate that the HAT layer enabled the aluminum layer to inject holes into it whether the aluminum layer is deposited below or above the HAT layer.

Example 12

Comparative Example 5

To the device fabricated in the Example 10 having the construction of "Glass substrate/Al(500 Å)/NPB(2000 Å)/Al (500 Å)," an electric potential was applied with the opposite polarity to that of Example 10, in which the aluminum located between the glass substrate and NPB layer acted as a cathode, and the aluminum located above the HAT acted as an anode. When the forward bias was applied, almost no current was observed at a potential difference of above 20V. The voltage-current relationship was also shown in FIG. 12.

What is claimed is:

1. An electroluminescent device, comprising:
   a cathode;
   an anode opposing the cathode, the anode comprising a reflective material and being reflective at least toward the cathode; and
   a functional layer located between the anode and cathode, the functional layer comprising a chemical compound of Formula I:

Formula I

Formula I wherein R1-R6 are independently chosen from the group consisting of hydrogen, halo, nitrile (—CN), nitro (—$NO_2$), sulfonyl (—$SO_2R$), sulfoxide (—SOR), sulfonamide (—$SO_2NR$), sulfonate (—$SO_3R$), trifluoromethyl (—$CF_3$), ester (—CO—OR), amide (—CO—NHR or —CO—NRR'), straight-chain or branched (substituted or unsubstituted) $C_1$-$C_{12}$ alkoxy, straight-chain or branched (substituted or unsubstituted) $C_1$-$C_{12}$ alkyl, aromatic or non-aromatic (substituted or unsubstituted) heterocyclic, substituted or unsubstituted aryl, mono- or di-(substituted or unsubstituted)arylamine, and (substituted or unsubstituted)alkyl-(substituted or unsubstituted)arylamine.

2. The device of claim 1, wherein the reflective material has a reflectivity from about 0.4 to about 1.

3. The device of claim 1, wherein the reflective material is selected from the group consisting of aluminum, silver, gold, nickel, chromium, molybdenum, tantalum, titanium, and zinc.

4. The device of claim 1, wherein the reflective material is reflective to all of the wavelength components of visible light.

5. The device of claim 1 further comprising at least one light-emitting layer and a buffer layer, wherein
the reflective material is a conductive material having a work function not greater than about 4.5 eV;
the cathode opposing the anode is formed of a conductive material;
the at least one light-emitting layer is located between the anode and cathode;
the anode is configured to inject holes in a direction toward the at least one light-emitting layer;
the cathode is configured to inject electrons in a direction toward the at least one-light-emitting layer;
the buffer layer contacts either the anode or cathode on a side thereof toward the at least one light-emitting layer; and
the buffer layer is formed of at least one non-conductive material.

6. The device of claim 5, wherein the buffer layer contacts the anode.

7. The device of claim 6, wherein the anode comprises aluminum, and wherein the buffer layer comprises aluminum oxide.

8. The device of claim 6, further comprising another buffer layer contacting the cathode and located between the cathode and the at least one light-emitting layer.

9. The device of claim 6, further comprising a hole-injecting layer located between the buffer layer and the light-emitting layer.

10. The device of claim 9, wherein the hole-injecting layer is located in the functional layer and comprises a chemical compound of Formula I:

wherein R1-R6 are independently chosen from the group consisting of hydrogen, halo, nitrile (—CN), nitro (—$NO_2$), sulfonyl (—$SO_2R$), sulfoxide (—SOR), sulfonamide (—$SO_2NR$), sulfonate (—$SO_3R$), trifluoromethyl (—$CF_3$), ester (—CO—OR), amide (—CO—NHR or —CO—NRR'), straight-chain or branched (substituted or unsubstituted) $C_1$-$C_{12}$ alkoxy, straight-chain or branched (substituted or unsubstituted) $C_1$-$C_{12}$ alkyl, aromatic or non-aromatic (substituted or unsubstituted) heterocyclic, substituted or unsubstituted aryl, mono- or di-(substituted or unsubstituted)arylamine, and (substituted or unsubstituted)alkyl-(substituted or unsubstituted)arylamine.

11. The device of claim 5, wherein the buffer layer contacts the anode on the side thereof toward the at least one light-emitting layer, and has a small thickness sufficient to allow holes to pass therethrough.

12. The device of claim 5, wherein the buffer layer has a thickness from about 5 Å to about 40 Å.

13. The device of claim 5, wherein the buffer layer has a thickness from about 10 Å to about 20 Å.

14. The device of claim 5, wherein the at least one non-conductive material is selected from the group consisting of aluminum oxide, titanium oxide, zinc oxide, ruthenium oxide, nickel oxide, zirconium oxide, tantalum oxide, magnesium oxide, calcium oxide, strontium oxide, vanadium oxide, yttrium oxide, lithium oxide, cesium oxide, chromium oxide, silicon oxide, barium oxide, manganese oxide, cobalt oxide, copper oxide, praseodymium oxide, tungsten oxide, germanium oxide, potassium oxide, lithium fluoride, magnesium fluoride, cesium fluoride, calcium fluoride, sodium chloride, potassium chloride, lithium metaborate ($LiBO_2$), potassium silicate ($K_2SiO_3$), silicon-germanium oxides, barium titanate, lithium tantalate ($LiTaO_3$), silicon nitride ($Si_3N_4$), boron nitride (BN), nitrides of elements in Family III or IV of the Periodic Table of the Elements, zinc sulfide (ZnS), cadmium sulfide (CdS), cadmium selenide (CdSe), gallium phosphide (GaP) and gallium nitride (GaN).

15. The device of claim 1, wherein the functional layer further comprises:
an anode contacting layer contacting the anode between the anode and cathode;
a cathode contacting layer contacting the cathode between the anode and cathode; and
means for forming a virtual electrode within at least one of the anode contacting layer and the cathode contacting layer.

* * * * *